United States Patent
Tian et al.

(10) Patent No.: US 9,865,435 B2
(45) Date of Patent: Jan. 9, 2018

(54) PLASMA GENERATOR, ANNEALING DEVICE, DEPOSITION CRYSTALLIZATION APPARATUS AND ANNEALING PROCESS

(71) Applicant: BOE TECHNOLOGY GROUP CO., LTD., Beijing (CN)

(72) Inventors: Xiangjun Tian, Beijing (CN); Seiji Fujino, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/035,074

(22) PCT Filed: Nov. 13, 2015

(86) PCT No.: PCT/CN2015/094581
§ 371 (c)(1),
(2) Date: May 6, 2016

(87) PCT Pub. No.: WO2016/184056
PCT Pub. Date: Nov. 24, 2016

(65) Prior Publication Data
US 2017/0103876 A1    Apr. 13, 2017

(30) Foreign Application Priority Data

May 18, 2015    (CN) .......................... 2015 1 0254387

(51) Int. Cl.
*H01L 21/00*    (2006.01)
*H01J 37/32*    (2006.01)
(Continued)

(52) U.S. Cl.
CPC ........ *H01J 37/32568* (2013.01); *C23C 16/24* (2013.01); *C23C 16/50* (2013.01);
(Continued)

(58) Field of Classification Search
CPC .......... H01J 37/32568; H01J 37/32431; H01J 37/32532; H01J 37/32522; H01J 37/32889
See application file for complete search history.

(56) References Cited

U.S. PATENT DOCUMENTS

2005/0164487 A1    7/2005    Seutter et al.
2009/0111244 A1*   4/2009    Yamazaki .............. B23K 26/03
                                                    438/458
(Continued)

FOREIGN PATENT DOCUMENTS

CN    1275635 A    12/2000
CN    201039578 Y    3/2008
(Continued)

OTHER PUBLICATIONS

International Search Report and Written Opinion dated Feb. 4, 2016; Appln. No. PCT/CN2015/094581.
(Continued)

*Primary Examiner* — Selim Ahmed
*Assistant Examiner* — Evan Clinton
(74) *Attorney, Agent, or Firm* — Ladas & Parry LLP (57) ABSTRACT

A plasma generator, a plasma annealing device, a deposition crystallization apparatus and a plasma annealing process are disclosed. The plasma generator includes: a gas chamber; a gas intake member configured to introduce a gas into the gas chamber; a cathode and an anode that are configured to apply an electric field to the gas introduced into the gas chamber to ionize the gas into plasma; a cooling water circulation member configured to control a temperature of the plasma generator; and a plasma beam outlet disposed on a top face of the gas chamber. The plasma annealing device including the plasma generator can generate a plasma beam,
(Continued)

which can be used in annealing to amorphous silicon and crystallize the amorphous silicon to polycrystalline silicon.

18 Claims, 5 Drawing Sheets

(51) Int. Cl.
    *H01L 21/02* (2006.01)
    *C23C 16/24* (2006.01)
    *C23C 16/50* (2006.01)
    *C23C 16/52* (2006.01)

(52) U.S. Cl.
    CPC ........ *C23C 16/52* (2013.01); *H01J 37/32541* (2013.01); *H01J 37/32605* (2013.01); *H01L 21/02532* (2013.01); *H01L 21/02592* (2013.01); *H01L 21/02689* (2013.01); *H01J 2237/3321* (2013.01); *H01L 21/02691* (2013.01)

(56) References Cited

U.S. PATENT DOCUMENTS

| | | | |
|---|---|---|---|
| 2009/0250341 A1* | 10/2009 | Ockenfuss | H01J 37/3438 204/298.14 |
| 2009/0253246 A1 | 10/2009 | Fukuoka et al. | |
| 2013/0064750 A1* | 3/2013 | Zettl | C04B 35/6229 423/290 |
| 2013/0160710 A1* | 6/2013 | Pei | H01J 37/3244 118/723 E |
| 2013/0224396 A1* | 8/2013 | Furusho | H01L 21/02532 427/539 |
| 2014/0174359 A1 | 6/2014 | Tabata et al. | |
| 2014/0227527 A1 | 8/2014 | Brors et al. | |

FOREIGN PATENT DOCUMENTS

| | | |
|---|---|---|
| CN | 101236906 A | 8/2008 |
| CN | 101336467 A | 12/2008 |
| CN | 103260330 A | 8/2013 |
| CN | 103337457 A | 10/2013 |
| CN | 103458602 A | 12/2013 |
| CN | 203690350 U | 7/2014 |
| CN | 104040675 A | 9/2014 |
| CN | 104822219 A | 8/2015 |
| GB | 2192644 A | 1/1988 |
| JP | 2010-209446 A | 9/2010 |

OTHER PUBLICATIONS

Li Zhi; "Study on Crystallization Process of Hydrogenated Amorphous Silicon Thin Film", China Master's Theses Full-text Database, Basic Science, vol. 04, Apr. 15, 2011; pp. 7-17, Abstract pp. 6 & 7.

First Chinese Office Action dated Oct. 27, 2016, Appln. No. 201510254387.8.

* cited by examiner

PLASMA GENERATOR, ANNEALING DEVICE, DEPOSITION CRYSTALLIZATION APPARATUS AND ANNEALING PROCESS

TECHNICAL FIELD

At least one embodiment of the present disclosure relates to a plasma generator, an annealing device, a deposition crystallization apparatus and an annealing process.

BACKGROUND

In the liquid crystal panel industry, usually excimer laser annealing (ELA) process is a crystallization technique used to crystallize amorphous silicon (a-Si) to polycrystalline silicon. With respect to ELA process, gases used in a laser generator mainly include process gases, such as halogen gas, Xe gas, Ne gas, and/or He gas, with great variety and large usage quantity. Moreover, service life of the gases is usually three (3) to five (5) days, and the gas(es) in the apparatus must be replaced when its service time reaches this value even if the gas is not being used. Therefore, gas consumption is large, and a great operation cost occurs to the manufacturer.

An ELA apparatus mainly includes following elements/devices: a laser generator, an optical element, an annealing element, a controller, and a transmission element. The ELA apparatus are so large that it covers an area of tens of square meters to hundreds of square meters and has a weight of dozens of tons. The maintenance cost is high and risk rate is increased because of the complicated structures of the ELA apparatus.

Moreover, most of the components in an ELA apparatus are consumable components, for example, the continuous service life of a laser tube of a laser generator is only about half a year, but a price of the laser tube is above multi-million RMB. In addition, the prices of elements such as a gas pure element, a high voltage element, a pulse extent element, an optical module are all very expensive, and these elements to some extent belong to consumable components. Therefore, a great operation cost is brought due to frequently replace consumption components of an ELA apparatus.

SUMMARY

At least one embodiment of the present disclosure provides a plasma generator, a plasma annealing device, a deposition crystallization apparatus and a plasma annealing process. A new annealing process and a new annealing device, which can be used in amorphous silicon annealing and crystallize amorphous silicon to polycrystalline silicon, is provided by at least one embodiment of the present disclosure. At least one embodiment of the present disclosure provides a plasma generator, a plasma annealing device including the plasma generator, a deposition crystallization apparatus including the plasma annealing device, and a plasma annealing process, the plasma annealing device including the plasma generator can generate a plasma beam, which can be used in annealing to amorphous silicon and crystallize the amorphous silicon to polycrystalline silicon.

At least one embodiment of the present disclosure provides a plasma generator comprising: a gas chamber; a gas intake member configured to introduce a gas into the gas chamber; a cathode and an anode that are configured to apply an electric field to the gas introduced into the gas chamber to ionize the gas into plasma; a cooling water circulation member configured to control a temperature of the plasma generator; and a plasma beam outlet disposed on a top face of the gas chamber.

For example, in the plasma generator provided by one embodiment of the present disclosure, the anode is disposed in the gas chamber, the cathode is as a top face of the gas chamber or is disposed on the top face of the gas chamber.

For example, in the plasma generator provided by one embodiment of the present disclosure, the anode and the cathode are replaceable or have an adjustable size.

For example, the plasma generator provided by one embodiment of the present disclosure further comprises an insulating plate, and the insulating plate is disposed below the anode.

For example, in the plasma generator provided by one embodiment of the present disclosure, the cooling water circulation member comprises a cooling water pipe, and the cooling water pipe is disposed in the anode and in a side wall of the gas chamber.

At least one embodiment of the present disclosure provides a plasma annealing device comprises a vacuum chamber and any one of the above-mentioned plasma generators.

For example, the plasma annealing device provided by one embodiment of the present disclosure further comprises a first electrode plate and a second electrode plate that are disposed on the vacuum chamber and configured to apply an accelerating electric field to the plasma.

For example, the plasma annealing device provided by one embodiment of the present disclosure further comprises a magnetic member being disposed on a path of a plasma beam of the plasma generator and configured to apply a magnetic field to the plasma beam.

For example, the plasma annealing device provided by one embodiment of the present disclosure further comprises a controller and a platform configured to bear a substrate, wherein the controller is configured to control the platform to move in a three-dimensional space.

For example, in the plasma annealing device provided by one embodiment of the present disclosure, the platform is disposed above or below the plasma generator, and a distance between the plasma generator and the substrate is in a range of 1-10 mm.

For example, in the plasma annealing device provided by one embodiment of the present disclosure, the distance between the plasma generator and the substrate is 3 mm.

For example, in the plasma annealing device provided by one embodiment of the present disclosure, a voltage of the electric field between the cathode and the anode is in a range of 1.0-3.0 KV.

At least one embodiment of the present disclosure provides a deposition crystallization apparatus comprising a chemical vapor deposition device and any one of the above-mentioned plasma annealing devices, and the vacuum chamber of the plasma annealing device is combined with a vacuum chamber of the chemical vapor deposition device.

For example, in the deposition crystallization apparatus provided by one embodiment of the present disclosure, the platform is disposed above the plasma generator, and a turnover mechanism is disposed in the vacuum chamber of the chemical vapor deposition device or in the vacuum chamber of the plasma annealing device.

At least one embodiment of the present disclosure provides a plasma annealing process comprising: performing an annealing process to a substrate that is provided with an amorphous silicon thin film by adopting plasma to crystallize the amorphous silicon to form polycrystalline silicon.

For example, in the plasma annealing process provided by one embodiment of the present disclosure, and the plasma is argon plasma.

For example, in the plasma annealing process provided by one embodiment of the present disclosure, the plasma annealing process is performed in a plasma annealing device, the plasma annealing device comprises a vacuum chamber and a plasma generator in the vacuum chamber; and the plasma generator comprises: a gas chamber; a gas intake member configured to introduce a gas into the gas chamber; a cathode and an anode that are configured to apply an electric field to the gas introduced into the gas chamber to ionize the gas into plasma; a cooling water circulation member configured to control a temperature of the plasma generator; and a plasma beam outlet disposed on a top face of the gas chamber.

For example, in the plasma annealing process provided by one embodiment of the present disclosure, a voltage of the electric field between the cathode and the anode is in a range of 1.0-3.0 KV.

For example, in the plasma annealing process provided by one embodiment of the present disclosure, the substrate that is provided with an amorphous silicon thin film is disposed above or below the plasma generator.

For example, in the plasma annealing process provided by one embodiment of the present disclosure, and a distance between the plasma generator and the substrate being provided with an amorphous silicon thin film is in a range of 1-10 mm.

For example, in the plasma annealing process provided by one embodiment of the present disclosure, the distance between the plasma generator and the substrate being provided with an amorphous silicon thin film is 3 mm.

For example, the plasma annealing process provided by one embodiment of the present disclosure, before the annealing process, further comprises baking the substrate being provided with an amorphous silicon thin film.

For example, in the plasma annealing process provided by one embodiment of the present disclosure, the vacuum chamber of the plasma annealing device is combined with a vacuum chamber of a chemical vapor deposition device, before the annealing process to the substrate that is provided with an amorphous silicon thin film, no cleaning process is performed to the substrate after being baked.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

REFERENCE NUMERALS

1—plasma annealing device; 2—CVD device; 3—deposition crystallization apparatus; 101—gas chamber; 102—gas intake member; 103—cathode; 104—anode; 105—cooling water circulation member; 106—plasma beam outlet; 107—insulating plate; 108—magnetic member; 109—first electrode plate; 110—second electrode plate; 111—gas; 112—plasma beam; 10—plasma generator; 20—platform; 30—vacuum chamber; 30'—vacuum chamber of CVD device; 40—substrate; 50—controller; 60—turnover mechanism; 1011—bottom face of gas chamber; 1021—gas intake pipe of gas intake member; 1051—cooling water pipe.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Because various process gases such as Halogen gas, Xe gas, Ne gas, and/or He gas are needed in an excimer laser annealing device, and the usage quantity is large. Therefore, operation cost is high for the laser annealing method.

With respect to wiring distribution, an excimer laser annealing device is a single device, and cannot be connected with other devices, so labor cost is increased, and particle introduced opportunity is increased too.

In terms of process, the laser characteristics of an excimer laser annealing device will be changed with the consumption of the gases, or laser stability is limited.

Figure 1:
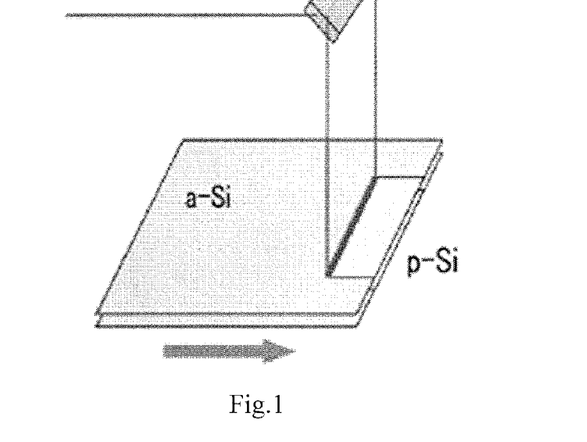
FIG. 1 is a schematic diagram of a scanning process to a substrate in an ELA process.

Because an excimer laser annealing device is large, a manufacture has to choose an integrate device, the probability of substrate oxidation and pollution are increased. Moreover, a window of an excimer laser annealing device is small, the stability of thin film transistors (TFTs) manufactured with it are not high. A scanning method is illustrated in FIG. 1 in a typical excimer laser annealing technique. Excimer laser generator is provided at a higher level, a platform bearing a substrate thereon is at a lower level, laser is irradiated on to the movable platform, and the conversion from amorphous silicon to polycrystalline silicon is realized.

It is to be noted that, in description of embodiments of the present disclosure, terms "on," "under," "top face," "bottom face" and the like indicate a location or a position shown in the figures, only to describe the embodiments of the present disclosure conveniently and simply, but not to indicate or suggest that the device or element must have a corresponding location, and be structured and operated in a specific position, and therefore, they cannot be understood as a limitation to the present disclosure.

Several embodiments of the present disclosure are illustrated in the following.

Embodiment 1

Figure 2:
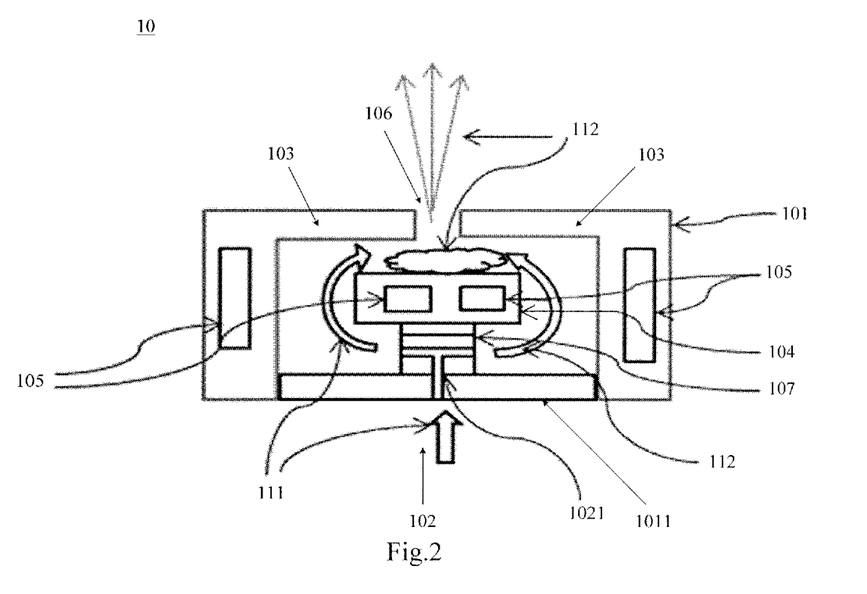
FIG. 2 is a sectional schematic view of a plasma generator provided by an embodiment of the present disclosure.

As illustrated in FIG. 2, the embodiment provides a plasma generator 10. The plasma generator includes: a gas chamber 101; a gas intake member 102 configured to introduce gas 111 into the gas chamber 101; a cathode 103 and an anode 104 which are configured to apply an electric field to the gas 111 introduced into the gas chamber 101 to ionize the gas into plasma; a cooling water circulation member 105 configured to control the temperature of the plasma generator 10; and a plasma beam outlet 106 disposed on a top face of the gas chamber 101.

For example, as illustrated in FIG. 2, in the plasma generator 10 provided by an example of the embodiment, the anode 104 is disposed in the gas chamber 101, the cathode 103 is provided as a top face of the gas chamber 101 or is disposed on the top face of the gas chamber 101. Side walls of the gas chamber 101 can also be formed integrally with the cathode 103 that is provided as the top face. A (e.g., strong) electric filed is created by the cathode 103 and the anode 104 upon a voltage being applied across them.

For example, in an example of the embodiment, the anode 104 and the cathode 103 are replaceable or have an adjustable size. By changing a size of the anode 104 and the cathode 103 and setting the anode 104 and the cathode 103 to an appropriate voltage value, the requirement of adjusting the plasma beam outlet (opening size) can be satisfied, and linearization of a plasma beam 112 is realized, and a large amount of treatment by optical systems is not needed any more. A voltage between the cathode 103 and the anode 104 of the plasma generator 10 can be provided by a voltage source, and the voltage source can have a wide voltage range to adjust the state of the plasma beam conveniently and flexibly.

For example, as illustrated in FIG. 2, the plasma generator provided by an example of the embodiment can further include an insulating plate 107, and the insulating plate 107 is disposed below the anode 104. The insulating plate 107 is configured to insulate the anode 104 and a component that is adjacent to the anode 104.

Figure 3:
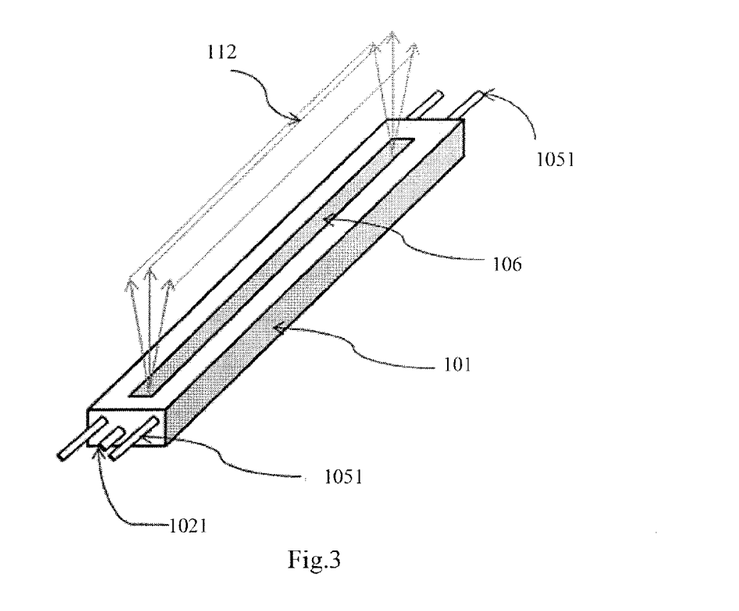
FIG. 3 is a perspective schematic view of a plasma generator provided by an embodiment of the present disclosure.

For example, as illustrated in FIG. 2 and FIG. 3, in the plasma generator provided by an example of the embodiment, the gas intake member 102 includes a gas intake pipe 1021. The gas 111 can be introduced into the gas chamber 101 through the gas intake pipe 1021. The gas intake pipe 1021 can pass through a bottom face 1011 and/or a side wall of the gas chamber 101.

For example, as illustrated in FIG. 3, in the plasma generator provided by an example of the embodiment, the cooling water circulation member 105 includes a cooling water pipe 1051. For example, the cooling water pipe 1051 can be disposed in the anode 104 and in a side wall or side walls of the gas chamber 101. But the position of the cooling water pipe 1051 is not limited here. A temperature of the plasma generator 10 is controlled by the cooling water circulation member to make the plasma in a designed temperature. For example, the temperature of plasma can be increased by reducing the cooling water flow rate of the cooling water circulation member, or the temperature of plasma can be reduced by increasing the cooling water flow rate of the cooling water circulation member.

For example, in the plasma generator provided by an example of the embodiment, the gas intake member 102 is configured to introduce (input) a gas to be ionized to generate plasma. For example, the gas can be argon gas to generate argon plasma.

Figure 4:
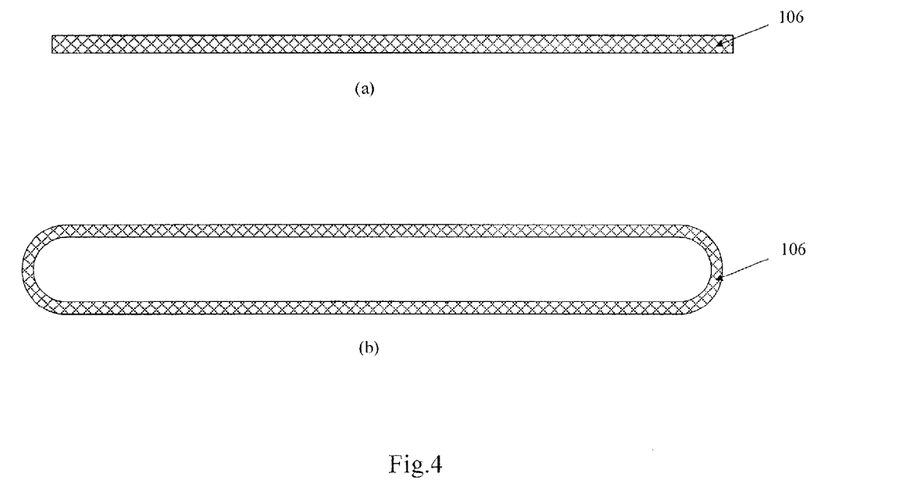
FIG. 4 is a schematic view of a plasma beam outlet in a plasma generator provided by an embodiment of the present disclosure, which is in a line type (a) and is in a ring type (b)

For example, in the plasma generator provided by an example of the embodiment, the plasma beam outlet 106 of the plasma generator can be in a line type, as illustrated in FIG. 3 and FIG. 4(a), or can be in a ring type, as illustrated in FIG. 4(b). But the plasma beam outlet 106 is not limited thereto, and different types can be adopted as required.

For example, in the plasma generator provided by an example of the embodiment, the gas introduced by the gas intake member is argon gas. Because the gas can use argon gas only, traditional process gases such as halogen, Xe, Ne, and/or He need not be used anymore, and operation cost is reduced remarkably.

Embodiment 2

Figure 5:
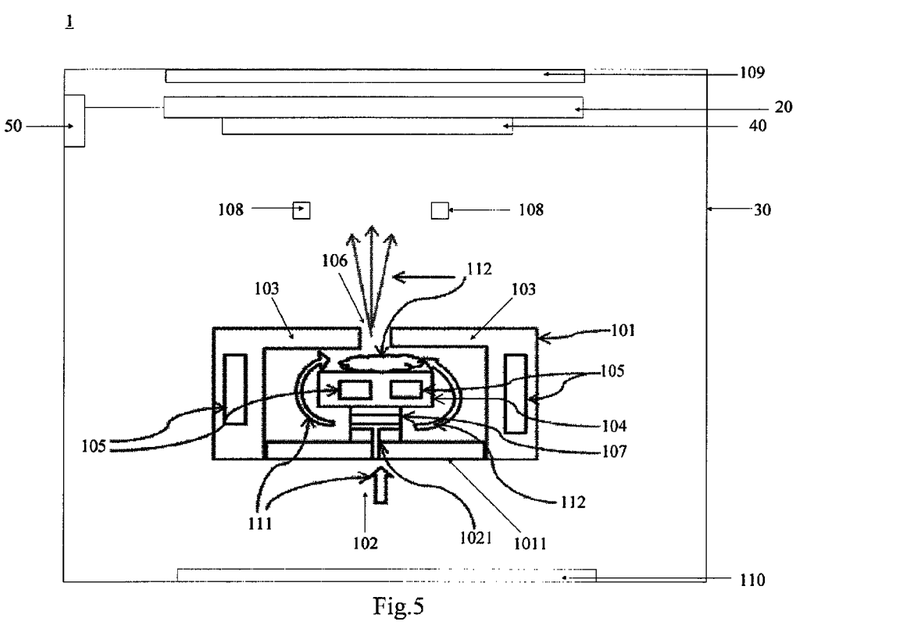
FIG. 5 is a sectional schematic view of a plasma annealing device provided by an embodiment of the present disclosure.

The embodiment provides a plasma annealing device 1, as illustrated in FIG. 5, including a vacuum chamber 30 and any one of the plasma generators 10 of embodiment 1.

For example, as illustrated in FIG. 5, the plasma annealing device provided by an example of the embodiment can further include a first electrode plate 109 and a second electrode plate 110 being disposed on the vacuum chamber 30 and configured to apply an accelerating electric field to the plasma. The voltage of a voltage source for the plasma accelerating electric field generated between the first electrode plate 109 and the second electrode plate 110 can be chosen from a wide range to adjust plasma acceleration speed effectively. For example, the first electrode plate 109 and the second electrode plate 110 can be disposed on a top face and a bottom face of the vacuum chamber 30, but their positions are not limited here.

For example, as illustrated in FIG. 5, the plasma annealing device provided by an example of the embodiment can further include a magnetic member 108 that is disposed on the path of a plasma beam 112 of the plasma generator 10 and configured to apply a magnetic field to the plasma beam 112. The magnetic member 108 for example can be disposed in a ring shape on the path of the plasma beam 112. FIG. 5 can illustrate a sectional view of a ring-shaped magnetic member. For example, after the plasma beam is accelerated by the accelerating electric field, effective ions can be chosen fur further use by manes of the magnetic field added on the path 112 of the plasma beam 112. The magnetic member 108 that can choose effective ions will be proper.

For example, as illustrated in FIG. 5, the plasma annealing device provided by an example of the embodiment can further include a controller 50 and a platform 20 configured to bear a substrate 40; in the plasma annealing device, the controller 50 is configured to control the platform 20 to move in a three-dimensional space. The controller 50 for example can be a general-purpose computer or a special-purpose computer device; for example a stepping motor, etc. can be used to move the platform 20 accurately. In a design, the platform 20 can be controlled to move in an up and down direction (Z axis), and flexible adjustment of the distance between the substrate 40 and the plasma generator can be realized to meet the requirement of flexible adjustment of plasma beam energy. For example, the controller 50 can also be controlled to move in a horizontal plane (X-Y plane).

For example, in the plasma annealing device provided by an example of the embodiment, the platform 20 faces the plasma generator 10, the platform 20 can be disposed above or below the plasma generator 10. In a case that the platform 20 is disposed above the plasma generator, the plasma is irradiated from bottom to top, and therefore the negative impact of particles in environment can be reduced.

For example, in the plasma annealing device provided by an example of the embodiment, when in a plasma annealing process, the distance between the plasma generator 10 and the substrate 40 is in a range of 1 nm-10 mm.

For example, in the plasma annealing device provided by an example of the embodiment, the voltage of the electric field generated between the cathode 103 and the anode 104 is in a range of 1.0 KV-3.0 KV.

For example, in the plasma annealing device 10 provided by an example of the embodiment, the plasma generator 10 can generate a uniform plasma beam by means of appropriate voltage control for the cathode 103 and the anode 104, argon gas flow rate control, temperature control of the circulation cooling water etc., and the energy of the plasma can meet the annealing conditions of the amorphous silicon, uniformity is good, and process requirement is satisfied.

For example, in the plasma annealing device provided by an example of the embodiment, the plasma generator can be disposed on a bottom plate or a upper plate (upper face) of the plasma annealing device, but the position is not limited here, as long as the position of the plasma generator does not affect application of the plasma beam.

Any one of the above-mentioned plasma annealing device provided by the embodiment, in comparison with a typical ELA device, has a simple structure, a uniform plasma beam, and a smaller size.

For example, in an applied electric field argon gas is used to generate plasma, and then the accelerate voltage of the plasma and the distance from the plasma to the substrate 40 are controlled, amorphous silicon can be crystallized to realize a good crystallization effect. The plasma annealing device of the embodiment is simple, and different from the typical integrate ELA device, and can be combined with a CVD device. For example, add a PA chamber to a CAD device to form a new combined device, which can be called as a deposition crystallization apparatus (CVD-PA apparatus).

Embodiment 3

Figure 6:
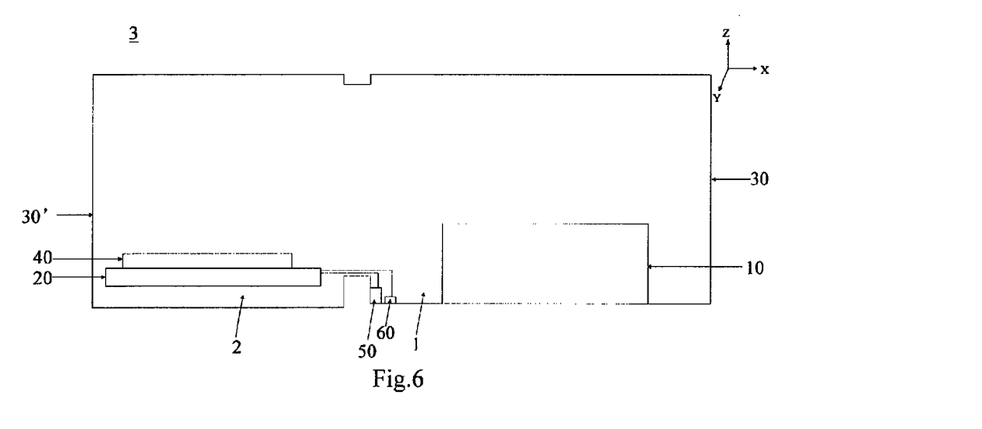
FIG. 6 is a schematic view of a deposition crystallization apparatus, which is formed by connection of a plasma generator and a chemical vapor deposition (CVD) device, provided by an embodiment of the present disclosure.

The embodiment provides a deposition crystallization apparatus (CVD-PA apparatus) 3, as illustrated in FIG. 6, including a chemical vapor deposition (CVD) device 2 and any one of the plasma annealing devices 1 of embodiment 2. The vacuum chamber 30 of the plasma annealing device 1 is connected with a vacuum chamber 30' of the CVD device 2.

It is to be noted that "connect" here also refers to "communicate", that is, the vacuum chamber 30 of the plasma annealing device 1 is communicated with a vacuum chamber 30' of the chemical vapor deposition device 2.

Figure 7:
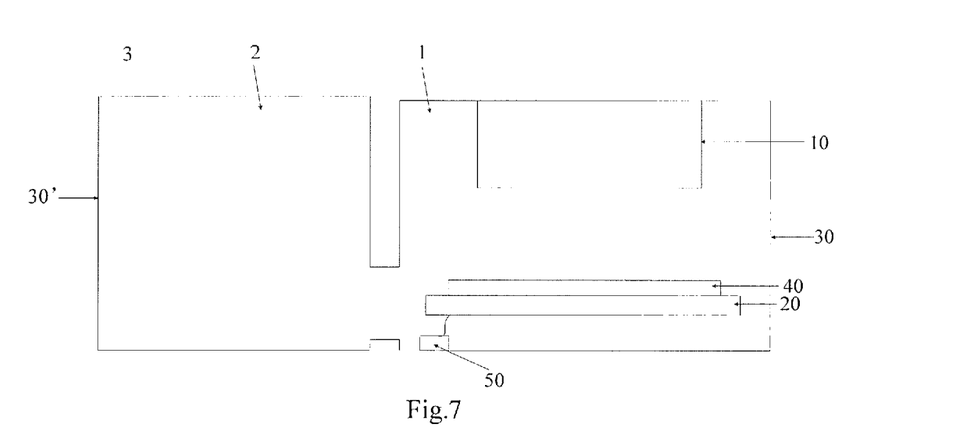
FIG. 7 is a schematic view of a deposition crystallization apparatus, which is formed by connection of a plasma generator and a CVD device, provided by another embodiment of the present disclosure.

For example, as illustrated in FIG. 6, in the deposition crystallization apparatus 3, in a plasma annealing process, the platform 20 is disposed above the plasma generator 10, a turnover mechanism 60 is disposed in the vacuum chamber 30' of the CVD device 2 or in the vacuum chamber 30 of the plasma annealing device 1, and is configured to turnover the platform 20. For example, after the platform 20 is turned over in the vacuum chamber 30' of the CVD device 2, the platform 20 enters in the vacuum chamber 30 of the plasma annealing device 1 and moves to above the plasma generator 10, and then an annealing process can be performed. If in deposition the substrate 40 is located in the upper side of the vacuum chamber 30' of the CVD device 2, a turnover mechanism 60 can be disposed in the vacuum chamber 30'. If in deposition the substrate is located in the lower side of the vacuum chamber 30' of the CVD device 2, a turnover mechanism 60 can be omitted, as illustrated in FIG. 7. In FIG. 7, the plasma beam outlet is disposed on the bottom face of the gas chamber 101 of the plasma generator 10.

Compared with an integrate ELA device, a PA device has at least one of the following merits.

(1) The PA device has a simple structure, does not need long distance optical transmission, and therefore, has good plasma beam uniformity.

(2) The PA device does not need optical transmission, a size of the plasma generator is small, and therefore, the PA device is small in size, and cost is low.

(3) The gas used may be a single kind of gas, for example argon gas, and operation cost is low.

(4) Only by replacing the anode and/or the cathode, or adjusting the size of the anode and/or the cathode, opening width and opening shape i.e., width and shape of a plasma beam can be adjusted, and the adjustment of the plasma beam is convenient.

(5) Because the PA device can be produced in a small size, in order to prevent the substrate 40 deposited with amorphous silicon (a-Si) from contacting air to avoid causing defect such as oxidation etc., the PA device can be connected with the CVD device, so that after a-Si deposition and baking, the substrate 40 can be moved directly from the vacuum chamber 30' to the PA device to form a combination device, and this new device can be called a CVD-PA apparatus.

(6) Because the substrate 40 in the vacuum environment is not exposed to the air and therefore does not affected by the air, the characteristics of the a-Si can be easily controlled, and a cleaning process using HF is not needed.

(7) It is convenient to design the substrate 40 in a face-down mode, to reduce particles effectively. A face-up mode can also be realized.

Embodiment 4

The embodiment provides a plasma annealing (PA) process including: performing an annealing process to a substrate 40 which is provided with an amorphous silicon thin film by using plasma to crystallize the amorphous silicon to form polycrystalline silicon. The plasma annealing process is a new a-Si annealing process, and is a vacuum crystallization method using plasma process, and plasma is used as an annealing source.

For example, in the plasma annealing process provided by an example of the embodiment, the plasma can be argon plasma. Usually, the gas used to generate plasma is Ar (argon gas).

For example, in the plasma annealing process provided by an example of the embodiment, the plasma annealing process is performed in a plasma annealing device, the plasma annealing device includes a vacuum chamber 30 and a plasma generator in the vacuum chamber 30; and the plasma generator includes: a gas chamber 101, a gas intake member 102 configured to introduce a gas into the gas chamber 101, a cathode 103 and an anode 104 that are configured to apply an electric field to the gas introduced into the gas chamber 101 to ionize the gas into plasma, a cooling water circulation member 105 to control a temperature of the plasma generator, and a plasma beam outlet 106 disposed on a top face of the gas chamber 101. The temperature of the plasma generator is controlled by means of the cooling water circulation member 105. The gas, i.e., argon gas, can be ionized to form plasma by an electric field generated by applying a voltage across the cathode 103 and the anode 104. For example, the plasma annealing device can adopt any one of the plasma annealing devices of embodiment 2.

For example, in the plasma annealing process provided by an example of the embodiment, the plasma is obtained by ionizing argon gas in an electric field in a plasma generator.

For example, in the plasma annealing process provided by an example of the embodiment, a voltage of the electric field between the cathode 103 and the anode 104 is in a range of 1.0-3.0 KV. The ionization of argon gas is controlled by controlling the voltage of the electric field between the cathode 103 and the anode 104, and the voltage control affects process remarkably. For example, the voltage cannot be too large, otherwise the electric field can be so strong that ions can be implanted into the substrate 40 like an implanter.

For example, in the plasma annealing process provided by an example of the embodiment, the substrate 40 that is provided with an amorphous silicon thin film can be disposed above or below the plasma generator.

For example, in the plasma annealing process provided by an example of the embodiment, during an annealing process, the distance between the plasma generator and the substrate 40 that is provided with an amorphous silicon thin film is in a range of 1-10 mm. The distance is an important factor to affect the process. The distance can be designed to be controllable, usually, the distance can be 3 mm, otherwise the plasma may not reach the substrate to provide enough heat, or energy is too large to generate defect such as ion implanting.

Figure 8:
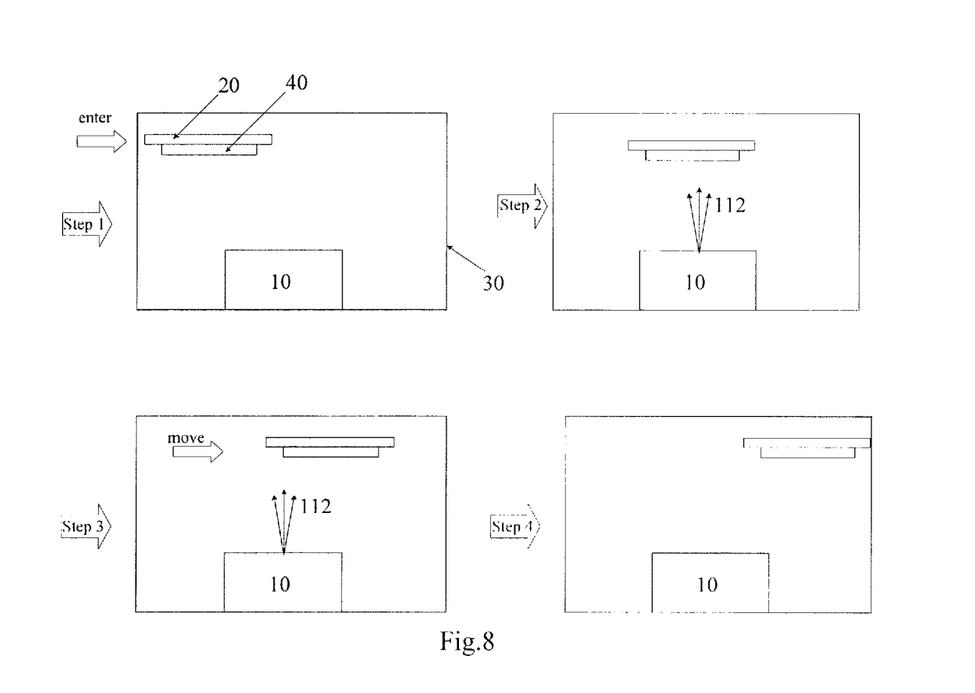
FIG. 8 is a schematic view of a plasma annealing (PA) process provided by an embodiment of the present disclosure.

For example, in the plasma annealing (PA) process, a scanning method of the substrate 40 is illustrated in FIG. 8; the drawing shows a face-down type in which the substrate is at an upper level and the plasma beam is at a lower level (the platform is disposed above the plasma generator), and therefore, particle generation can be avoided. A type in which the plasma beam is an upper level and the substrate is at a lower level can also be adopted (the platform is disposed below the plasma generator). The process can include following steps.

Step 1: allowing the substrate 40 to enter the vacuum chamber 30 of a PA device from the upstream vacuum chamber e.g. the vacuum chamber 30' of the CVD device.

Step 2: turning on the plasma beam, e.g. argon plasma beam.

Step 3: allowing the platform 20 to carry the substrate 40 to move with respect to the plasma beam to realize plasma beam scanning.

Step 4: finishing movement of the platform 20, and turning off the plasma beam.

For example, the plasma annealing process provided by an example of the embodiment, before the annealing process, further includes a step of baking the substrate 40 that is provided with an amorphous silicon thin film.

For example, in the plasma annealing process provided by an example of the embodiment, the vacuum chamber 30 of the plasma annealing device is connected with a vacuum chamber 30' of a CVD device, before the annealing process to the substrate that is provided with an amorphous silicon thin film, it is not necessary to perform a cleaning process to the substrate after being baked.

Figure 9:
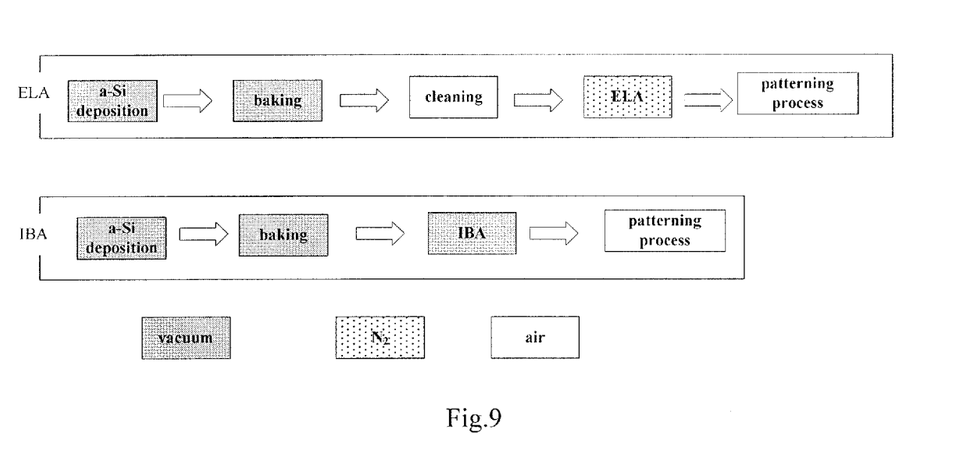
FIG. 9 is a process flow comparison diagram between an ELA process and a PA process provided by an embodiment of the present disclosure.

FIG. 9 is a process flow comparison diagram between an ELA process and a PA process provided by one embodiment of the present disclosure. From FIG. 9, it can be seen that, by means of a PA process, the process of cleaning performed after baking the substrate 40 can be omitted. The PA method, with respect to the ELA method, has a simple process flow, because the annealing is concluded in a vacuum environment, the substrate 40 will not be oxidized, and particles from external environment cannot be introduced, and processes such as a cleaning using HF and a particle cleaning are not needed any more. From this point of view, operation cost can be reduced by reducing process flow.

It is to be noted that, the embodiments and the drawings only a schematic depiction related to the present disclosure, others not involved can be referred to a usual design.

At least one embodiment of the present disclosure provides a plasma generator, a plasma annealing device, a deposition crystallization apparatus and a plasma annealing process. The plasma generator comprising: a gas chamber; a gas intake member configured to introduce a gas into the gas chamber; a cathode and an anode that are configured to apply an electric field to the gas introduced into the gas chamber to ionize the gas into plasma; a cooling water circulation member to control a temperature of the plasma generator; and a plasma beam outlet disposed on a top face of the gas chamber. The plasma annealing device including the plasma generator can generate a plasma beam, which can be used in annealing amorphous silicon and crystallize the amorphous silicon to polycrystalline silicon. The annealing process provided by at least one embodiment of the present disclosure uses plasma as an annealing source to make an amorphous silicon thin film to be crystallized to a polycrystalline silicon thin film.

What are described above is related to the illustrative embodiments of the present disclosure only and not limitative to the protecting scope of the present disclosure. The protecting scopes of the present disclosure are defined by the accompanying claims.

This application claims the benefit of priority from Chinese patent application No. 201510254387.8, filed on May 18, 2015, the present disclosure of which is incorporated herein in its entirety by reference as a part of the present application.

What is claimed is:

1. A plasma annealing device comprising a vacuum chamber and a plasma generator, the plasma generator comprising:
    a gas chamber;
    a gas intake member configured to introduce a gas into the gas chamber;
    a cathode and an anode that are configured to apply an electric field to the gas introduced into the gas chamber to ionize the gas into plasma;
    a cooling water circulation member configured to control a temperature of the plasma generator; and
    a plasma beam outlet disposed on a top face of the gas chamber;
    wherein the plasma annealing device further comprises a first electrode plate and a second electrode plate that are disposed on the vacuum chamber and configured to apply an accelerating electric field to the plasma.

2. The plasma annealing device according to claim 1, further comprising a magnetic member that is disposed on a path of a plasma beam of the plasma generator and configured to apply a magnetic field to the plasma beam.

3. The plasma annealing device according to claim 1, further comprising a controller and a platform configured to bear a substrate, wherein the controller is configured to control the platform to move in a three-dimensional space.

4. A deposition crystallization apparatus comprising a chemical vapor deposition device and the plasma annealing device according to claim 1, wherein the vacuum chamber of the plasma annealing device is combined with a vacuum chamber of the chemical vapor deposition device.

5. The deposition crystallization apparatus according to claim 4, wherein the platform is disposed above the plasma generator, and a turnover mechanism is disposed in the vacuum chamber of the chemical vapor deposition device or in the vacuum chamber of the plasma annealing device.

6. The plasma annealing device according to claim 1, wherein the anode is disposed in the gas chamber, the cathode is provided as a top face of the gas chamber or is disposed on the top face of the gas chamber.

7. The plasma annealing device according to claim 1, wherein the anode and the cathode are replaceable or have an adjustable size.

8. The plasma annealing device according to claim 1, further comprising an insulating plate, wherein the insulating plate is disposed below the anode.

9. The plasma annealing device according to claim 1, wherein the cooling water circulation member comprises a cooling water pipe, and the cooling water pipe is disposed in the anode and in a side wall of the gas chamber.

10. A plasma annealing process comprising:
performing an annealing process to a substrate that is provided with an amorphous silicon thin film by adopting plasma to crystallize the amorphous silicon to form polycrystalline silicon; and
before the annealing process, further comprising baking the substrate being provided with an amorphous silicon thin film;
wherein a vacuum chamber of a plasma annealing device is combined with a vacuum chamber of a chemical vapor deposition device, and
before the annealing process to the substrate that is provided with an amorphous silicon thin film, no cleaning process is performed to the substrate after the substrate is baked.

11. The plasma annealing process according to claim 10, wherein the plasma is applied with an accelerating electric field.

12. The plasma annealing process according to claim 11, wherein the plasma annealing device further comprising a first electrode plate and a second electrode plate that are disposed on the vacuum chamber and configured to apply the accelerating electric field to the plasma.

13. The plasma annealing process according to claim 10, wherein the plasma is argon plasma.

14. The plasma annealing process according to claim 10, wherein the plasma annealing process is performed in a plasma annealing device, the plasma annealing device comprises a vacuum chamber and a plasma generator in the vacuum chamber; and
the plasma generator comprises: a gas chamber; a gas intake member configured to introduce a gas into the gas chamber; a cathode and an anode that are configured to apply an electric field to the gas introduced into the gas chamber to ionize the gas into plasma; a cooling water circulation member configured to control a temperature of the plasma generator; and a plasma beam outlet disposed on a top face of the gas chamber.

15. The plasma annealing process according to claim 14, wherein a voltage of the electric field between the cathode and the anode is in a range of 1.0-3.0 KV.

16. The plasma annealing process according to claim 14, wherein the substrate that is provided with an amorphous silicon thin film is disposed above or below the plasma generator.

17. The plasma annealing process according to claim 16, wherein a distance between the plasma generator and the substrate being provided with an amorphous silicon thin film is in a range of 1-10 mm.

18. The plasma annealing process according to claim 17, wherein the distance between the plasma generator and the substrate being provided with an amorphous silicon thin film is 3 mm.

* * * * *